United States Patent
Vadi

(10) Patent No.: US 7,129,762 B1
(45) Date of Patent: Oct. 31, 2006

(54) EFFICIENT IMPLEMENTATION OF A BYPASSABLE FLIP-FLOP WITH A CLOCK ENABLE

(75) Inventor: Vasisht Mantra Vadi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 35 days.

(21) Appl. No.: 11/059,967

(22) Filed: Feb. 17, 2005

(51) Int. Cl.
*H03K 3/12* (2006.01)
*H03K 3/289* (2006.01)

(52) U.S. Cl. ...................... 327/218; 327/203

(58) Field of Classification Search ............... 327/202, 327/203, 208, 210, 218
See application file for complete search history.

(56) References Cited

U.S. PATENT DOCUMENTS 5,656,962 A * 8/1997 Banik ...................... 327/202
6,803,799 B1 * 10/2004 Churchill et al. ........... 327/202
6,864,733 B1 * 3/2005 Anshumali et al. ......... 327/210

\* cited by examiner

*Primary Examiner*—Quan Tra
*Assistant Examiner*—Rey Aranda
(74) *Attorney, Agent, or Firm*—William L Paradice, III

(57) ABSTRACT

A flip-flop circuit includes a flip-flop, a first pass gate, a second pass gate, and a third pass gate. The first pass gate has an input to receive an input signal, an output coupled to the flip-flop's data input, and a control terminal to receive a first control signal. The second pass gate has an input coupled to the flip-flop's data input, an output coupled to the circuit's output, and a control terminal to receive a second control signal. The third pass gate has an input coupled to the flip-flop's data output, an output coupled to the circuit's output, and a control terminal to receive a third control signal. The first, second, and third control signals may be generated in response to various logical combinations of a bypass signal and a clock enable signal.

10 Claims, 7 Drawing Sheets

EFFICIENT IMPLEMENTATION OF A BYPASSABLE FLIP-FLOP WITH A CLOCK ENABLE

FIELD OF INVENTION

This invention relates to a flip-flop capable of implementing a bypass feature and a clock enable/disable feature.

DESCRIPTION OF RELATED ART

A flip-flop is a well-known circuit element that is commonly used to hold the logic state of a signal in a variety of clocked integrated circuit (IC) systems such as, for example, programmable logic devices (PLDs). Many flip-flops include a bypass feature that is controlled by a bypass signal. When the bypass signal is asserted, the signal bypasses the flip-flop, thereby allowing the signal to be routed asynchronously to other circuitry coupled to the flip-flop. When the bypass signal is de-asserted, logic state transitions of the signal are latched in the flip-flop in response to triggering edges of a clock signal for subsequent output from the flip-flop. Further, many flip-flops also include a clock enable/disable feature that is controlled by a clock enable signal. When the clock enable signal is asserted, logic state transitions of the signal may be propagated by the flip-flop in response to triggering edges of the clock signal. Conversely, when the clock enable signal is de-asserted, the current state of the signal is preserved by the flip-flop, irrespective of subsequent logic state transitions of the signal.

The bypass feature may be implemented by connecting an output multiplexer (MUX) to the data output of the flip-flop, and the clock enable/disable feature may be implemented by connecting an input MUX to the data input of the flip-flop. Together, the flip-flop, the input MUX, and the output MUX form a flip-flop circuit having a bypass feature and a clock enable/disable feature. Typically, the input MUX includes inputs coupled to the flip-flop circuit's input and output terminals, an output coupled to the data input of the flip-flop, and a control terminal to receive the clock enable signal. The output MUX typically includes a first input coupled to the data input of the flip-flop, a second input coupled to the data output of the flip-flop, a control terminal to receive the bypass signal, and an output coupled to an output of the flip-flop circuit. The various functional modes (e.g., normal, bypass, and clock disable) may be selected for the flip-flop circuit by controlling the logic states of the clock enable and bypass signals.

Although effective, prior techniques for implementing the clock enable/disable and bypass features of a flip-flop circuit not only consume valuable silicon area but also increase the capacitive loading on the flip-flop's input and output terminals, thereby undesirably increasing signal propagation delays in the flip-flop. Thus, it would be desirable to implement the bypass and clock enable/disable features of a flip-flop using circuitry that minimizes silicon area and reduces signal propagation delays.

SUMMARY

A flip-flop circuit is disclosed that implements the bypass and clock enable/disable features using circuitry that minimizes silicon area and reduces signal propagation delays. In accordance with the present invention, a flip-flop circuit includes a flip-flop, a first pass gate, a second pass gate, and a third pass gate. The first pass gate has an input to receive an input signal, an output coupled to a data input of the flip-flop, and a control terminal to receive a first control signal. The second pass gate has a first data terminal to the data input of the flip-flop, a second data terminal output coupled to an output of the flip-flop circuit, and a control terminal to receive a second control signal. The third pass gate has an input coupled to a data output of the flip-flop, an output coupled to the output of the flip-flop circuit, and a control terminal to receive a third control signal.

For some embodiments, the first, second, and third control signals, which select the various functional modes for the flip-flop circuit, may be generated by a control circuit in response to various logical combinations of a bypass signal and a clock enable signal. For example, the normal functional mode may be selected by asserting the clock enable signal and de-asserting the bypass signal. In response thereto, the control circuit asserts the first control signal to turn on the first pass gate, de-asserts the second control signal to turn off the second pass gate, and asserts the third control signal to turn on the third pass gate, thereby allowing logic state transitions of the input signal to be latched by the flip-flop in response to triggering edges of a clock signal. The bypass functional mode may be selected by asserting the bypass signal. In response thereto, the control circuit asserts the first control signal to turn on the first pass gate, asserts the second control signal to turn on the second pass gate, and de-asserts the third control signal to turn off the third pass gate, thereby allowing the input signal to propagate through the flip-flop circuit without passing through the flip-flop. The clock disable functional mode may be selected by de-asserting the clock enable signal while the bypass signal is de-asserted. In response thereto, the control circuit de-asserts the first control signal to turn off the first pass gate, asserts the second control signal to turn on the second pass gate, and asserts the third control signal to turn on the third pass gate, thereby routing the flip-flop's output as a feedback signal to the data input of the flip-flop to preserve the current state of the data signal.

In accordance with some embodiments of the present invention, the second pass gate is configured to operate as a bi-directional pass gate that can not only propagate the input signal directly to the flip-flop circuit's output without passing through the flip-flop (e.g., when the bypass mode is selected), but also propagate the flip-flop's output as a feedback signal to the data input of the flip-flop (e.g., when the clock disable mode is selected). In this manner, flip-flop circuits of the present invention may use the same pass gate to implement the bypass and clock enable/disable features, thereby reducing the number of pass gates required to implement the bypass and clock enable/disable features, for example, as compared to prior flip-flop circuits. Further, by reducing the number of pass gates coupled to the flip-flop's output, embodiments of the present invention may also reduce the capacitive load on the flip-flop's output, which in turn advantageously reduces the flip-flop's clock-to-out delay, for example, as compared to prior flip-flop circuits.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are applicable to a variety of integrated circuits and systems, and are particularly useful for devices requiring flip-flop circuits that include bypass and clock enable/disable features. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic levels assigned to various signals in the description below are arbitrary, and thus may be modified (e.g., reversed polarity) as desired. Accordingly, the present invention is not to be construed as limited to specific examples described herein but rather includes within its scope all embodiments defined by the appended claims.

Figure 1:
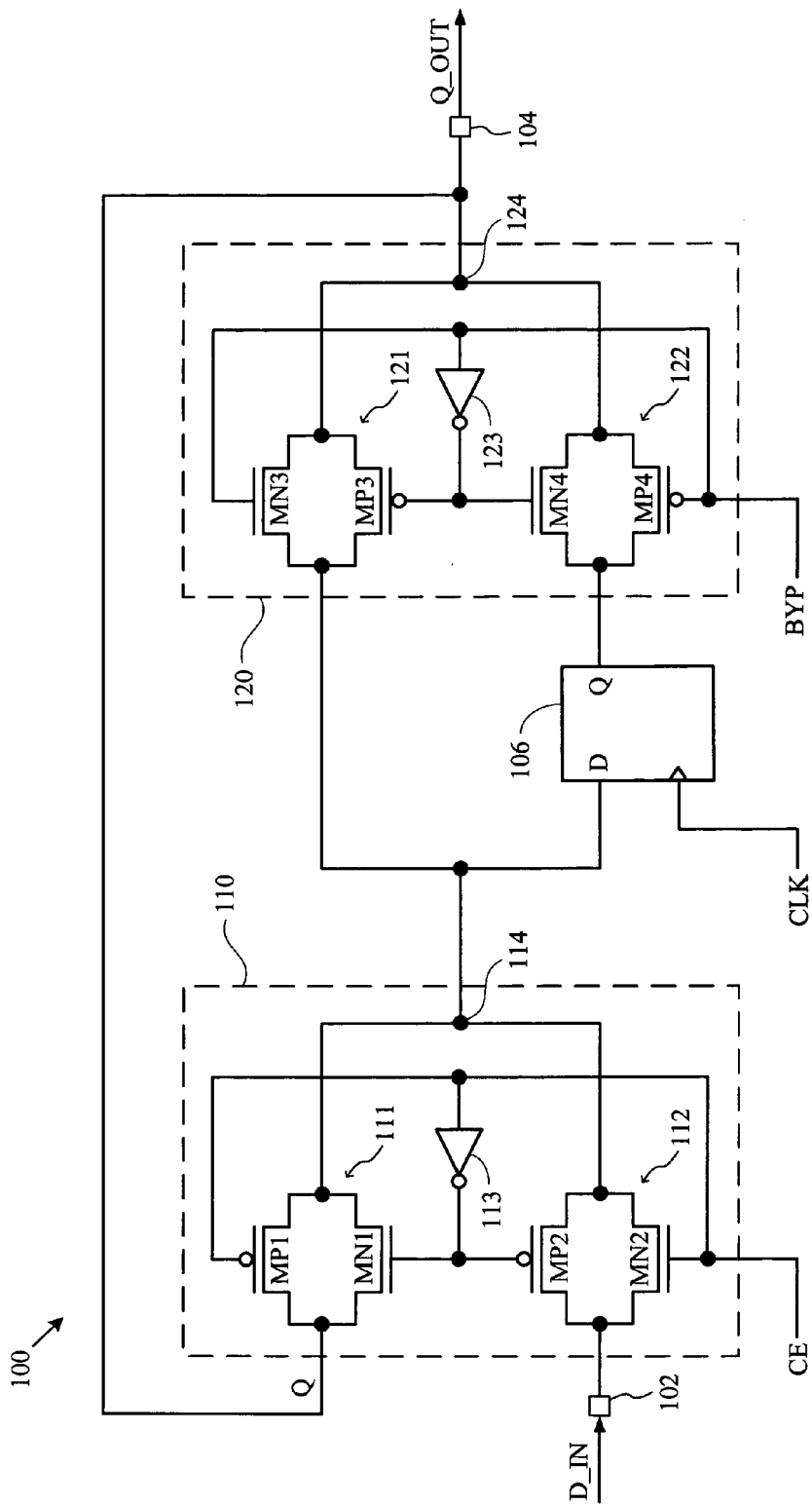
FIG. 1 is a circuit diagram of a conventional flip-flop circuit having bypass and clock enable/disable features.

The present invention overcomes the aforementioned disadvantages of previously known flip-flop circuits by using common circuitry to implement the bypass and clock enable/disable features of flip-flop circuits. First, the disadvantages of one such previously known flip-flop circuit are discussed below with respect to the prior art flip-flop circuit 100 shown in FIG. 1. Prior art flip-flop circuit 100 includes an input 102 to receive an input signal D_IN, an output 104 to provide an output signal Q_OUT, a flip-flop 106, an input MUX 110, and an output MUX 120. Input MUX 110, which is shown in FIG. 1 as including a first pass gate 111 formed by a PMOS transistor MP1 and an NMOS transistor MN1, a second pass gate 112 formed by a PMOS transistor MP2 and an NMOS transistor MN2, and an inverter 113, has a first input to receive D_IN, a second input coupled to circuit output 104, a control terminal to receive a clock enable signal CE, and an output 114. Flip-flop 106 includes a data input (D) coupled to the output 114 of input MUX 110, a clock terminal (>) to receive a clock signal CLK, and a data output (Q). Flip-flop 106, which is well-known, latches the logic state of its input signal in response to triggering (e.g., rising and/or falling) edges of CLK to generate an output signal Q. Output MUX 120, which is shown in FIG. 1 as including a first pass gate 121 formed by a PMOS transistor MP3 and an NMOS transistor MN3, a second pass gate 122 formed by a PMOS transistor MP4 and an NMOS transistor MN4, and an inverter 123, has a first input to coupled to the Q output of flip-flop 106, a second input coupled to the D input of flip-flop 106, a control terminal to receive a bypass signal BYP, and an output 124 coupled to circuit output 104.

During normal operation of flip-flop circuit 100, CE is asserted to logic high to enable the clock signal, and BYP is de-asserted to logic low to disable the bypass feature. The logic high state of CE turns off pass gate 111 and turns on pass gate 112, thereby causing input MUX 110 to propagate D_IN to the data input of flip-flop 106. In response to the triggering edges of CLK, flip-flop 106 latches the logic state transitions of D_IN and outputs the resulting latched signals via its data output Q. The logic low state of BYP turns off pass gate 121 and turns on pass gate 122, which causes output MUX 120 to provide the flip-flop's output signal Q as a registered output signal via circuit output 104.

To enable the bypass feature, CE and BYP are asserted to logic high. The logic high state of CE turns off pass gate 111 and turns on pass gate 112, which causes input MUX 110 to route D_IN to its output 114. The logic high state of BYP turns on pass gate 121 and turns off pass gate 122, which causes output MUX 120 to propagate D_IN directly from input MUX 110 to circuit output 104 as an unregistered output signal, thereby allowing D_IN to bypass flip-flop 106.

To disable the clock signal, CE and BYP are de-asserted to logic low. The logic low state of BYP turns off pass gate 121 and turns on pass gate 122, which causes output MUX 120 to route the Q output of flip-flop 106 to its output 124. The logic low state of CE turns on pass gate 111 and turns off pass gate 112, which causes input MUX 110 to route the Q output of flip-flop 106 from output MUX 120 as a feedback signal to the data input of flip-flop 106. In this manner, the logic state of the data signal latched by flip-flop 106 is maintained in its present state, e.g., without regard to logic state transitions of D_IN.

As shown in FIG. 1, input MUX 110 and output MUX 120 of flip-flop circuit 100 together require eight pass transistors MN1–MN4 and MP1–MP4. Thus, for IC devices that include many such flip-flop circuits, the ability to eliminate any of the pass transistors MN1–MN4 and/or MP1–MP4 from the flip-flop circuit may significantly reduce the silicon area consumed by such devices. Further, because the circuit's output 104 is coupled to input MUX 110 and to output MUX 120, both MUXes 110 and 120 contribute to the capacitive load on the circuit's output 104. Because the capacitive load on the circuit's output 104 affects the clock-to-out delay of flip-flop 106, which is often used as a performance (e.g., speed) indicator of the flip-flop circuit, the ability to reduce the capacitive load on the circuit's output 104 may significantly reduce the flip-flop's clock-to-out delay. Accordingly, as described in detail below, embodiments of the present invention may be used to implement the bypass and clock enable/disable features of a flip-flop circuit using circuitry that not only requires less transistors but also reduces the capacitive loading on the flip-flop circuit's output, which in turn conserves valuable silicon area and reduces the flip-flop's clock-to-out delay, respectively.

Figure 2:
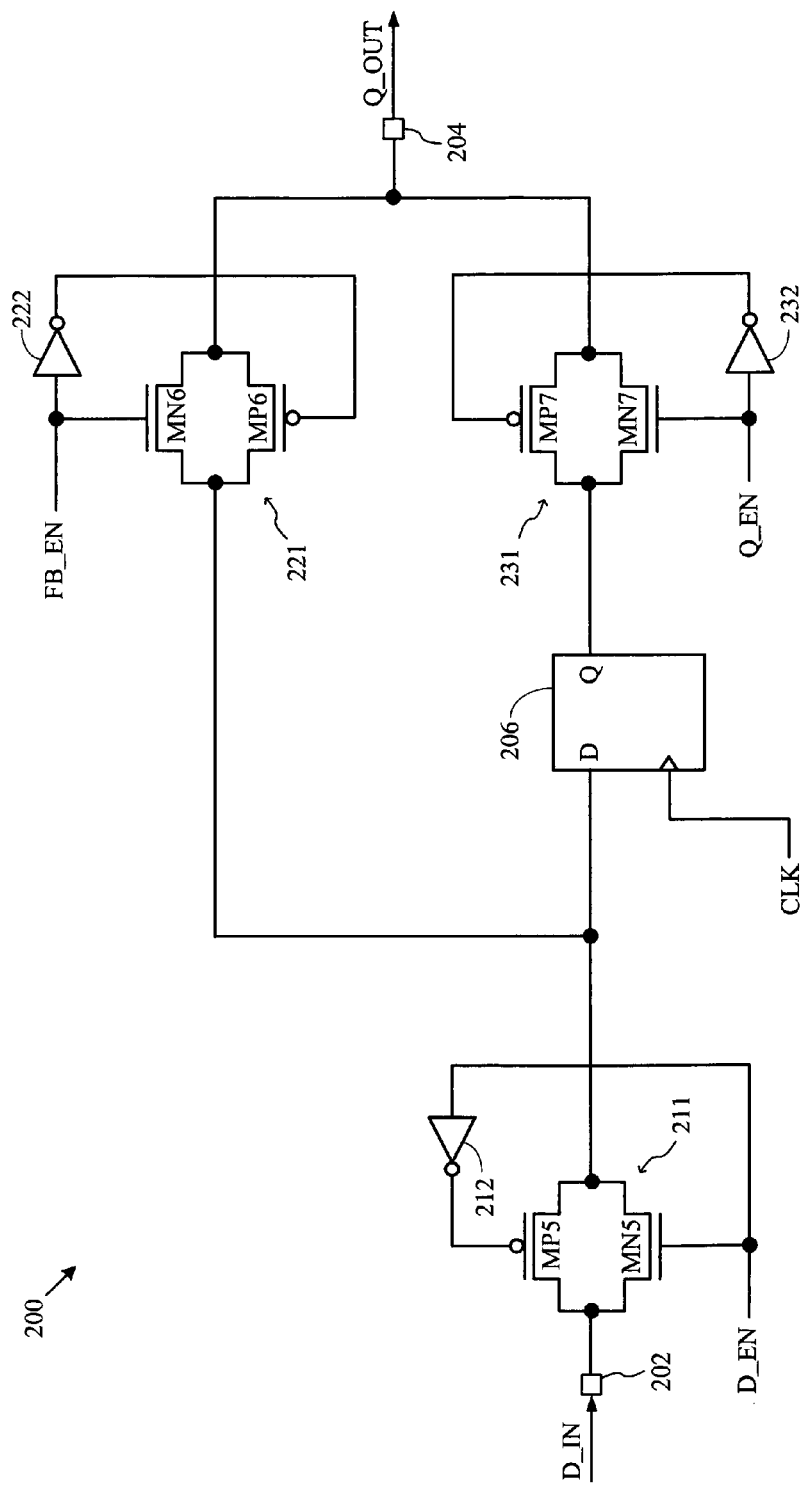
FIG. 2 is a circuit diagram of a flip-flop circuit having bypass and clock enable/disable features in accordance with one embodiment of the present invention.

FIG. 2 shows a flip-flop circuit 200 in accordance with one embodiment of the present invention. Flip-flop circuit 200 includes an input 202 to receive D_IN, an output 204 to provide Q_OUT, a flip-flop 206, a first pass gate 211, a second pass gate 221, and a third pass gate 231. First pass gate 211, which is formed by PMOS transistor MP5, NMOS transistor MN5, and inverter 212, includes an input to receive D_IN, a control terminal to receive a first control signal D_EN, and an output coupled to the D input of flip-flop 206. Flip-flop 206, which may be any well-known flip-flop, also includes a clock terminal to receive CLK and an output to provide a registered output signal Q. Second pass gate 221, which is formed by PMOS transistor MP6, NMOS transistor MN6, and inverter 222, includes a first data terminal coupled to the D input of flip-flop 206, a control terminal to receive a second control signal FB_EN, and a second data terminal coupled to the circuit's output 204. Third pass gate 231, which is formed by PMOS transistor MP7, NMOS transistor MN7, and inverter 232, includes an input coupled to the Q output of flip-flop 206, a control terminal to receive a third control signal Q_EN, and an output coupled to the circuit's output 204. As described in more detail below, second pass gate 221 operates as a bi-directional pass gate that not only may propagate the input signal D_IN from first pass gate 211 to the circuit's output 204 but may also propagate the Q output of flip-flop 206 from third pass gate 231 to the data input of flip-flop 206. In this manner, second pass gate 221 may be utilized to implement the bypass feature and the clock disable feature.

The NMOS pass transistors MN5–MN7, PMOS pass transistors MP5–MP7, flip-flop 206, and inverters 212, 222, and 232 may be implemented using well-known semiconductor fabrication techniques. For some embodiments, first pass gate 211 may be formed using only NMOS transistor MN5, second pass gate 221 may be formed using only NMOS transistor MN6, and third pass gate 231 may be formed using only NMOS transistor MN7. For other embodiments, first pass gate 211 may be formed using only PMOS transistor MP5, second pass gate 221 may be formed using only PMOS transistor MP6, and third pass gate 231 may be formed using only PMOS transistor MP7.

Further, although not shown in FIG. 2 for simplicity, for some embodiments, flip-flop 206 may include synchronous set and reset inputs to receive synchronous set and reset signals, respectively. For example, the synchronous set signal may be asserted to set the flip-flop output to a first logic state (e.g., logic high) upon a subsequent triggering edge of CLK, and the synchronous reset signal may be asserted to reset the flip-flop output to a second logic state (e.g., logic low) upon the subsequent triggering edge of CLK. For other embodiments, flip-flop 206 may also include an asynchronous set/reset input to receive an asynchronous set/reset signal that forces the flip-flop output to a desired logic state without regard to CLK. Providing flip-flop 206 with an asynchronous set/reset input allows a plurality of flip-flop circuits 200 provided in an IC device to be simultaneously forced to a desired logic state using a global set/reset signal, even where various ones of the flip-flop circuits are responsive to different clock signals (e.g., where various flip-flop circuits are asynchronous).

Figure 3:
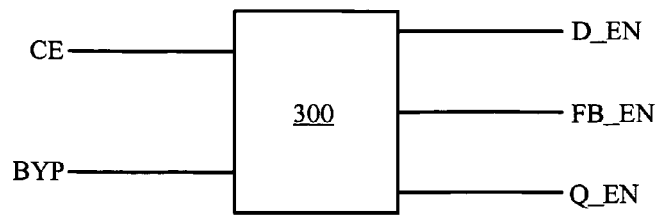
FIG. 3 is a block diagram of an exemplary control circuit for generating the control signals for the flip-flop circuit of FIG. 2.

As mentioned above, for some embodiments, the control signals D_EN, FB_EN, and Q_EN may be generated in response to different logical combinations of the clock enable signal CE and the bypass signal BYP. An exemplary operation of various functional modes of flip-flop circuit 200 is described below with respect to FIG. 3, which shows a control circuit 300 that generates D_EN, FB_EN, and Q_EN in response to CE and BYP to configure flip-flop circuit 200 for various functional modes. Referring also to FIG. 2, during normal operation of flip-flop circuit 200, the clock signal CLK is enabled by asserting CE to logic high, and the bypass feature is disabled by de-asserting BYP to logic low. In response thereto, control circuit 300 asserts D_EN to logic high, de-asserts FB_EN to logic low, and asserts Q_EN to logic high. The logic high state of D_EN turns on first pass gate 211, thereby causing D_IN to propagate to the data input of flip-flop 206. In response to the triggering edges of CLK, flip-flop 206 latches the logic state of D_IN for output to third pass gate 231. The logic high state of Q_EN turns on third pass gate 231, thereby allowing the latched state of D_IN to be provided as a registered output signal via the flip-flop circuit's output 204. The logic low state of FB_EN turns off second pass gate 221, thereby isolating the circuit's output 204 from the data input of flip-flop 206.

The bypass feature may be enabled by asserting BYP to logic high. In response thereto, control circuit 300 asserts D_EN to logic high, asserts FB_EN to logic high, and de-asserts Q_EN to logic low. The logic high state of D_EN turns on first pass gate 211, thereby causing D_IN to propagate through first pass gate 211. The logic high state of FB_EN turns on second pass gate 221, which propagates D_IN from first pass gate 211 as an unregistered output signal directly to the circuit's output 204 (e.g., without propagating D_IN through flip-flop 206). The logic low state of Q_EN turns off third pass gate 231, which isolates the circuit's output 204 from the data output of flip-flop 206. In this manner, the input signal D_IN bypasses flip-flop 206 and is provided directly to the circuit's output 204 via second pass gate 221.

To disable the clock signal CLK, CE may be de-asserted to logic low while BYP remains de-asserted. In response thereto, control circuit 300 de-asserts D_EN to logic low, asserts FB_EN to logic high, and asserts Q_EN to logic high. The logic low state of D_EN turns off first pass gate 211, thereby preventing D_IN from propagating to the data input of flip-flop 206. The logic high state of Q_EN turns on third pass gate 231, and the logic high state of FB_EN turns on second pass gate 221, thereby providing a feedback path from the data output of flip-flop 206 to the data input of flip-flop 206. In this manner, the logic state of the data signal latched in flip-flop 206 is maintained in its present state (e.g., irrespective of CLK).

For devices that include a plurality of flip-flop circuits 200, the control signals D_EN, FB_EN, and Q_EN generated by control circuit 300 may be used to control the functional modes of the plurality of flip-flop circuits. Thus, for such devices, only one control circuit 300 is required to control the functional modes of multiple flip-flop circuits 200.

The logic functions performed by control circuit 300 for the exemplary operation described above are summarized below in the truth table of Table 1, where "x" indicates a don't care logic state.

TABLE 1

| Functional mode | BYP | CE | D_EN | FB_EN | Q_EN |
|---|---|---|---|---|---|
| Normal operation | 0 | 1 | 1 | 0 | 1 |
| Enable bypass feature | 1 | x | 1 | 1 | 0 |
| Disable clock signal | 0 | 0 | 0 | 1 | 1 |

Figure 4:
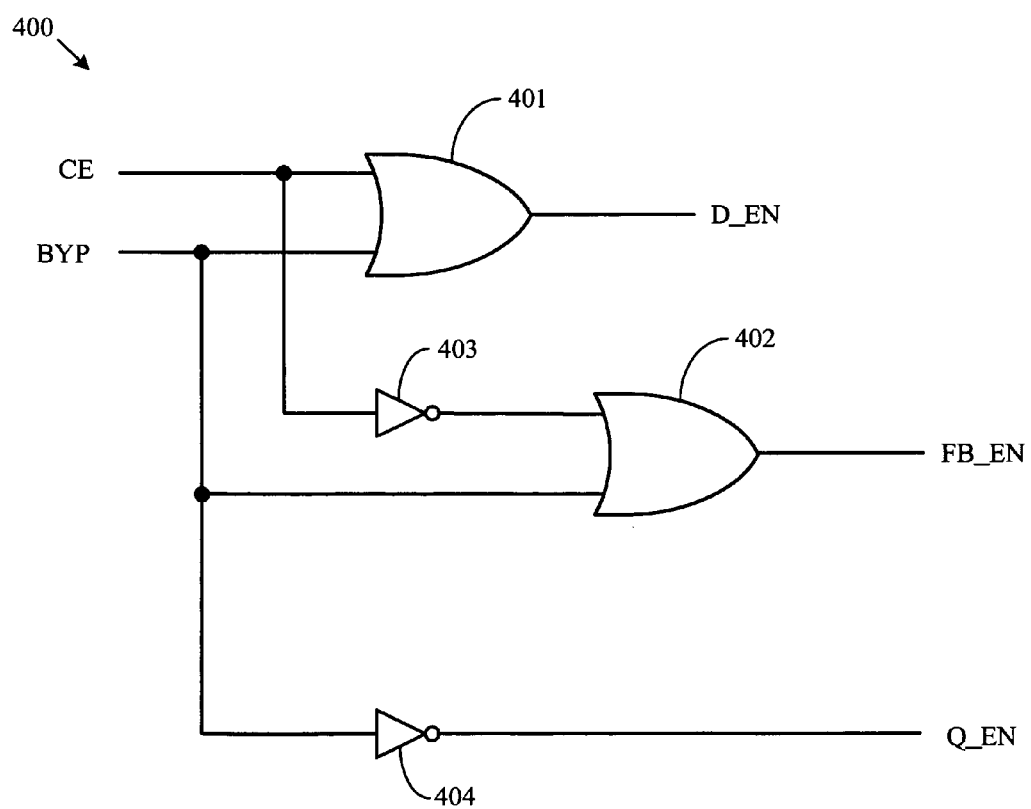
FIG. 4 is a circuit diagram of one embodiment of the control circuit of FIG. 3.

It is to be understood that many different circuit configurations may be used to perform the logic functions summarized above in Table 1. For example, FIG. 4 shows a control circuit 400 that is one embodiment of control circuit 300. Control circuit 400 includes OR gates 401–402 and inverters 403–404. OR gate 401 includes inputs to receive CE and BYP, and includes an output to generate D_EN. OR gate 402 includes a first input to receive the logical complement of CE via inverter 403, a second input to receive BYP, and an output to generate FB_EN. Inverter 404 generates Q_EN as the logical complement of BYP. The OR gates 401–402 and inverters 403–404 may be implemented using well-known circuits.

An exemplary operation of control circuit 400 for generating the control signals D_EN, FB_EN, and Q_EN for the various functional modes of flip-flop circuit 200 is described below with respect to FIGS. 2 and 4. During normal operation of flip-flop circuit 200, CE is asserted to logic high to enable the clock signal CLK, and BYP is de-asserted to logic low to disable the bypass feature. In response thereto, OR gate 401 asserts D_EN to logic high, OR gate 402 de-asserts FB_EN to logic low, and inverter 404 asserts Q_EN to logic high. The logic high state of D_EN turns on pass gate 211, the logic low state of FB_EN turns off pass gate 221, and the logic high state of Q_EN turns on pass gate 231. In this manner, the input signal D_IN propagates through flip-flop 206 and is provided as a registered output signal via the flip-flop circuit's output 204.

To enable the bypass feature, BYP is asserted to logic high. In response thereto, OR gate 401 asserts D_EN to logic high, OR gate 402 asserts FB_EN to logic high, and inverter 404 de-asserts Q_EN to logic low. The logic high state of D_EN turns on pass gate 211, the logic high state of FB_EN turns on pass gate 221, and the logic low state of Q_EN turns off pass gate 231. In this manner, the input signal DIN bypasses flip-flop 206 and is provided as an unregistered output signal via circuit output 204.

To disable the clock signal, CE is de-asserted to logic low, e.g., while BYP is de-asserted to logic low. In response thereto, OR gate 401 de-asserts D_EN to logic low, OR gate 402 asserts FB_EN to logic high, and inverter 404 asserts Q_EN to logic high. The logic low state of D_EN turns off pass gate 211, the logic high state of FB_EN turns on pass gate 221, and the logic high state of Q_EN turns on pass gate 231. In this manner, the Q output of flip-flop 206 is provided as a feedback signal to the data input of flip-flop 206, thereby maintaining the current state of the latched data signal.

As mentioned above, many different circuit configurations may be used to generate the control signals D_EN, FB_EN, and Q_EN in response to CE and BYP. Thus, for other embodiments, circuitry different from that shown in FIG. 4 may be used to implement control circuit 300.

Figure 5:
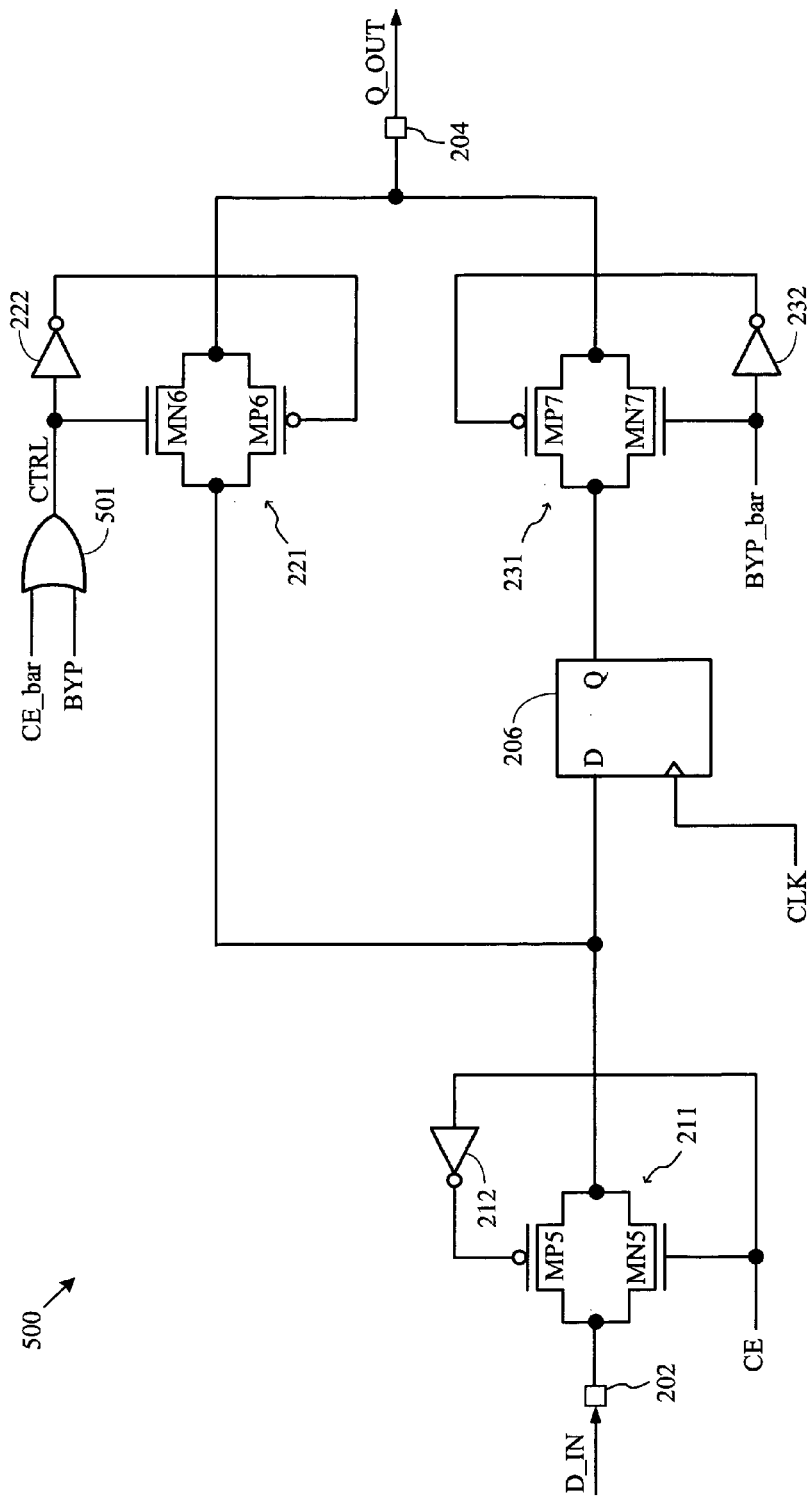
FIG. 5 is a circuit diagram of a flip-flop circuit having bypass and clock enable/disable features in accordance with another embodiment of the present invention.

For still other embodiments, the bypass and clock enable signals may be used as the control signals that control the operation of pass gates 211, 221, and 231. Thus, for some other embodiments, CE may be used to implement the first control signal, a logical combination of CE and BYP may be used to implement the second control signal, and BYP may be used to implement the third control signal. For example, FIG. 5 shows a flip-flop circuit 500 that is another embodiment of flip-flop circuit 200 of FIG. 2. Flip-flop circuit 500 is similar to flip-flop circuit 200, except that first pass gate 211 is responsive to CE, second pass gate 221 is responsive to a control signal CTRL that is generated as a logical OR combination of BYP and CE_bar by an OR gate 501, and third pass gate 231 is responsive to BYP_bar.

Thus, to select the normal functional mode for flip-flop circuit 500, CE is asserted to logic high and BYP is de-asserted to logic low. The logic high state of CE turns on first pass gate 211, the resulting logic low state of CTRL generated by OR gate 501 turns off second pass gate 221, and the complemented logic high state of BYP_bar turns on third pass gate 231, thereby allowing logic state transitions of D_IN to be latched by flip-flop 206 in response to triggering edges of CLK and provided as registered output signals via circuit output 204. To select the bypass functional mode, BYP is asserted to logic high. The logic high state of CE turns on first pass gate 211, the resulting logic high state of CTRL generated by OR gate 501 turns on second pass gate 221, and the complemented logic low state of BYP_bar turns off third pass gate 231, thereby allowing the input signal to propagate through flip-flop circuit 500 without passing through flip-flop 206. To disable CLK, CE and BYP are both de-asserted to logic low. The logic low state of CE turns off first pass gate 211, the resultant logic high state of CTRL generated by OR gate 501 turns on second pass gate 221, and the complemented logic high state of BYP_bar turns on third pass gate 231, thereby preserving the current state of the data latched by flip-flop 206.

For other embodiments, the polarities of pass transistors MP7 and MN7 of third pass gate 231 may be reversed, and BYP may be provided as the control signal for third pass gate 231.

Referring again to the exemplary embodiments of FIGS. 2 and 5, second pass gate 221 is configured to operate as a bi-directional pass gate that propagates D_IN to the flip-flop circuit's output 204 when the bypass mode is selected, and propagates the Q output of flip-flop 206 as a feedback signal to the data input of flip-flop 206 when the clock disable mode is selected. In this manner, flip-flop circuits 200 and 500 use the same pass gate (e.g., pass gate 221) to implement the bypass and clock enable/disable features. Accordingly, while the prior flip-flop circuit 100 shown in FIG. 1 requires four pass gates (e.g., pass gates 111, 112, 121, and 122) to implement the bypass and clock enable/disable features, Applicant's flip-flop circuits require only three pass gates (e.g., pass gates 211, 221, and 231) to implement the bypass and clock enable/disable features, thereby saving valuable silicon area, for example, as compared to prior flip-flop circuit 100. Thus, for a device requiring many flip-flop circuits that can implement the above-described bypass and clock enable/disable features, utilizing embodiments of the present invention to form such flip-flop circuits may significantly reduce the silicon area consumed by the device.

Further, embodiments of the present invention reduce the flip-flop's clock-to-out delay by reducing the capacitive load on the flip-flop circuit's output, as compared to prior flip-flop circuits. For example, while the output 104 of prior flip-flop circuit 100 is capacitively loaded by two MUXes 110 and 120 (e.g., which are formed using four pass gates 111, 112, 121, and 122), the output 204 of Applicant's flip-flop circuit 200 is capacitively loaded by only two pass gates (e.g., pass gates 221 and 231). The reduced capacitive load on the output 204 of flip-flop circuit 200 significantly reduces the clock-to-out delay of flip-flop 206, thereby improving the performance of flip-flop circuit 200, for example, as compared to prior flip-flop circuit 100. Embodiments of the present invention may also reduce the loading the input of flip-flop circuits 200/500.

Flip-flop circuits configured in accordance with the present invention may be used in various types of IC devices. For one example, flip-flop circuits 200/500 may be used as input and/or output registers in the CLB slices of a field programmable gate array (FPGA). For another example, flip-flop circuits 200/500 may be used as input and/or output registers in a digital signal processing (DSP) block of programmable logic devices such as FPGAs. Of course, flip-flop circuits 200/500 may be implemented in other circuit blocks of FPGAs, and may be utilized in other types of IC devices such as, for example, application-specific IC (ASIC) devices.

Figure 6:
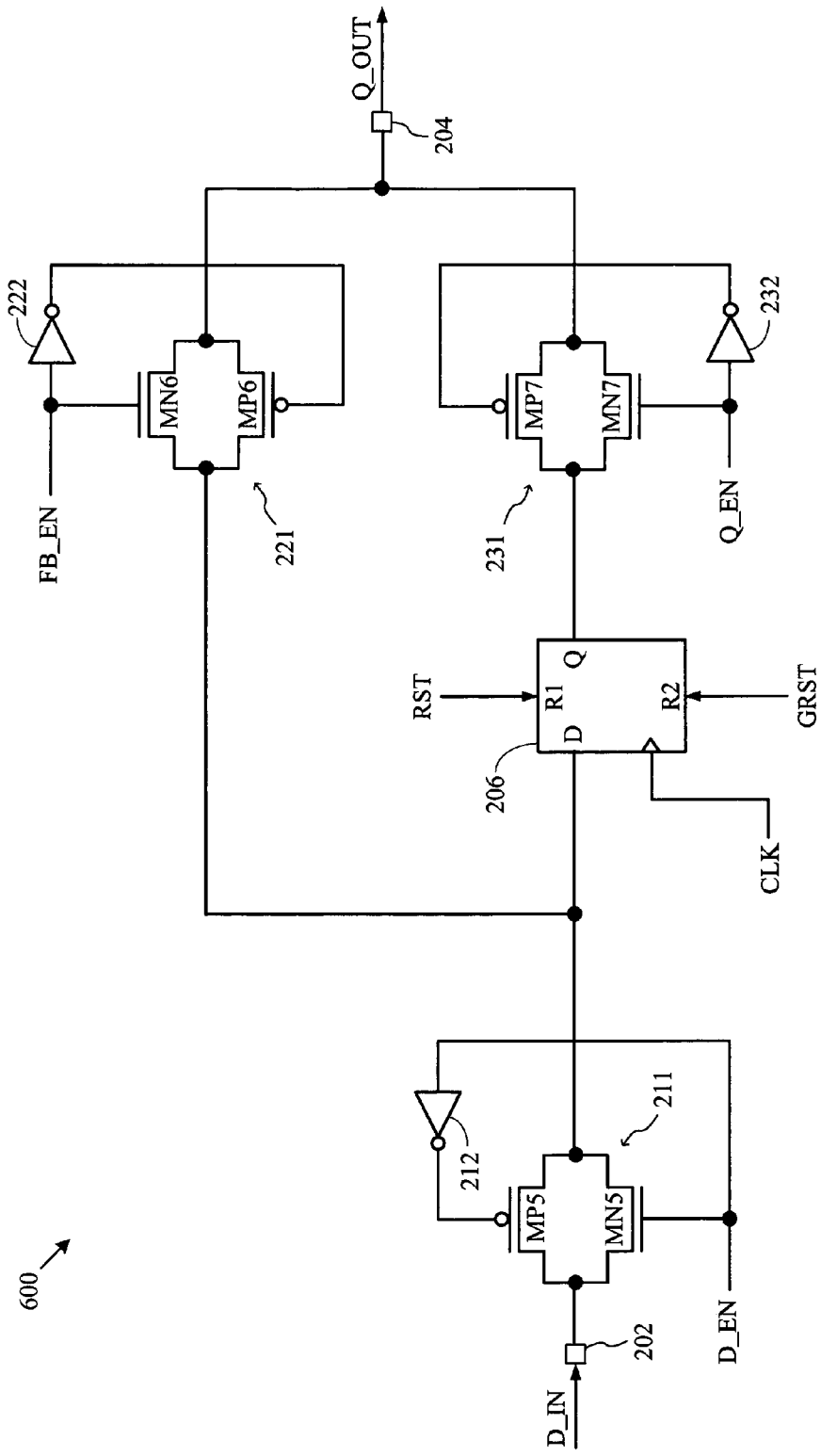
FIG. 6 is a circuit diagram of a flip-flop circuit having bypass and clock enable/disable features and responsive to synchronous reset and asynchronous reset signals in accordance with another embodiment of the present invention.

As mentioned above, for some embodiments, flip-flop 206 may include inputs to receive a synchronous set/reset signal and an asynchronous set/reset signal. For example, FIG. 6 shows a flip-flop circuit 600 in accordance with another embodiment of the present invention. For the embodiment of FIG. 6, which may be configured to operate in the normal, bypass, and/or clock disable modes as described above with respect to FIG. 2, flip-flop 206 has additional inputs R1 and R2 to receive a synchronous (e.g., local) reset signal RST and an asynchronous (e.g., global) reset signal GRST, respectively. For purposes of discussion herein, assertion of RST resets the output of flip-flop 206 to logic low upon a subsequent triggering edge of CLK, and assertion of GRST resets the output of flip-flop 206 to logic low without regard to CLK. Alternatively, flip-flop 206 may be configured to be responsive to a synchronous reset signal and an asynchronous reset signal using various well-known circuit techniques, and therefore is not described in further detail herein. Further, although described as receiving a synchronous reset signal and an asynchronous reset signal, for other embodiments flip-flop 206 may be configured to receive a synchronous set signal and an asynchronous set signal for setting the output of flip-flop 206 to a logic high state, as known in the art.

Figure 7:
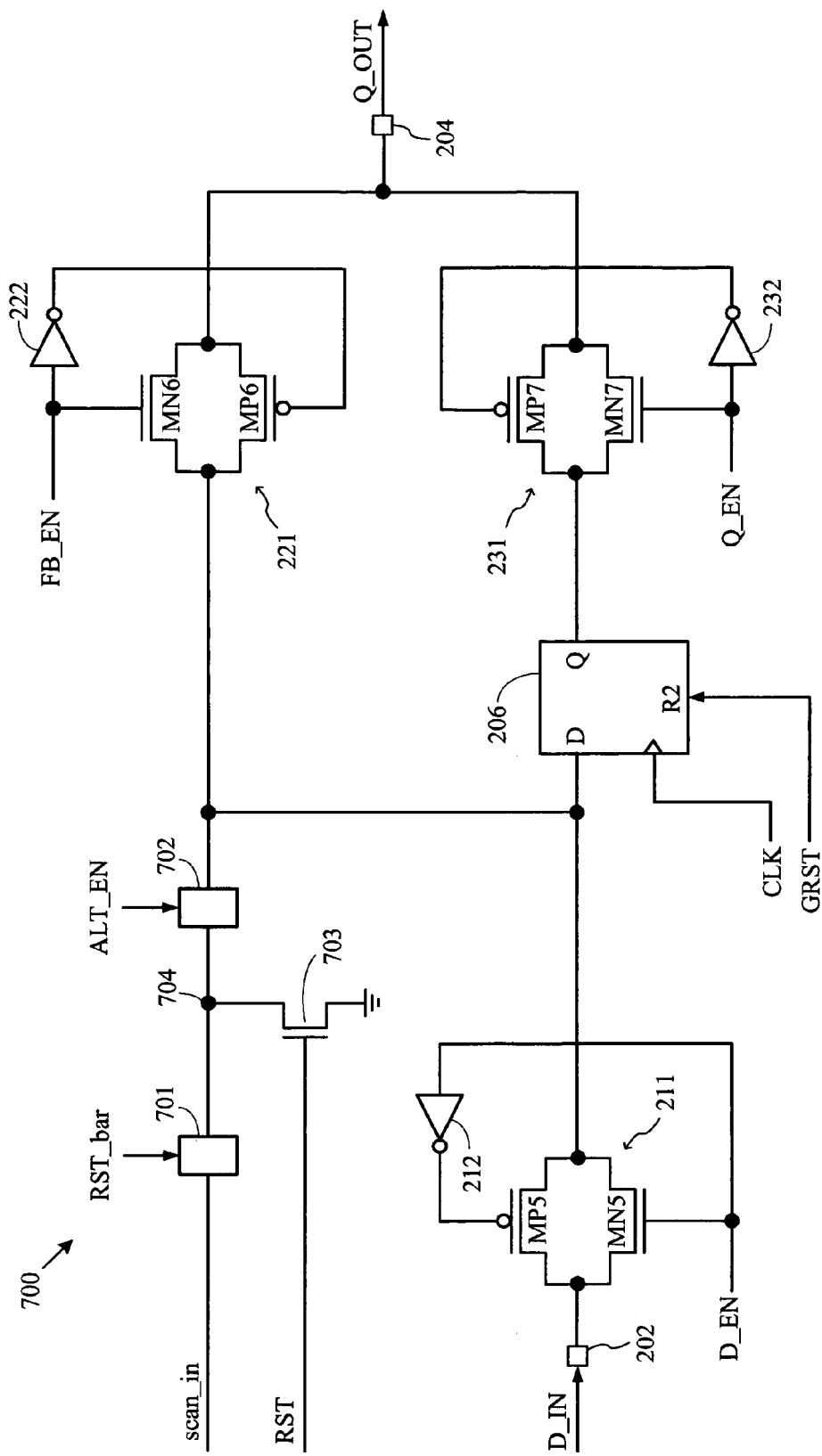
FIG. 7 is a circuit diagram of a flip-flop circuit having bypass and clock enable/disable features and capable of implementation within a scan chain in accordance with another embodiment of the present invention.

Flip-flop circuits of the present invention may also be configured to implement scan chain and synchronous reset features using minimal circuitry. For example, FIG. 7 shows a flip-flop circuit 700 in accordance with another embodiment of the present invention. Flip-flop circuit 700, which is similar to flip-flop circuit 200 of FIG. 2 and to flip-flop circuit 600 of FIG. 6, also includes pass gates 701–702 and an NMOS pull-down transistor 703. Pass gate 701 includes an input to receive a scan chain signal (scan_in), an output coupled to node 704, and a control terminal to receive the logical complement of RST (i.e., RST_bar). Pass gate 702 includes an input coupled to node 704, an output coupled to the first data terminal of second pass gate 221, and a control terminal to receive an alternate enable signal ALT_EN. Pull-down transistor 703 is coupled between node 704 and ground potential, and has a gate to receive RST. Pass gates 701 and 702 may be any well-known pass gates. For example, for some embodiments, pass gates 701 and 702 may be formed using circuitry similar to pass gates 211, 221, and/or 231.

To synchronously reset the flip-flop output to logic zero, RST and ALT_EN are asserted to logic high. Q_EN is also asserted, and D_EN and FB_EN are de-asserted. The asserted state of ALT_EN turns on pass gate 702, and the asserted state of RST turns on pull-down transistor 703, thereby pulling the D input of flip-flop 206 to logic low (e.g., ground potential) via pass gate 702. The resulting logic low input signal is latched by flip-flop 206 on the next triggering edge of CLK, thereby synchronously resetting the flip-flop output to logic low. The resulting de-asserted state of RST_bar turns off pass gate 701 to isolate node 704 from the scan chain input.

To include flip-flop circuit 700 as part of a scan chain, for example, during test operations of a device within which flip-flop circuit 700 may be implemented, RST is de-asserted to logic low and ALT_EN is asserted to logic high. Q_EN is asserted, and D_EN and FB_EN are de-asserted. The resulting asserted state of RST_bar turns on pass gate 701, and the asserted state of ALT_EN turns on pass gate 702. In this manner, the input scan chain signal scan_in may propagate through flip-flop 206 on the triggering edges of CLK and scanned out via circuit output 204. The de-asserted state of RST turns off pull-down transistor 703 to isolate node 704 from ground potential.

Embodiments of FIG. 7 may allow flip-flop circuit 700 to implement scan chain operations and synchronous reset operating using only two pass gates and one-pull-down transistor, which advantageously conserves circuit area and minimize input and output loading on flip-flop circuit 700.

The logic states of the various control signals for implementing the scan chain and synchronous reset features, as well as the bypass and clock enable/disable features, for flip-flop circuit 700 are summarized below in the truth table of Table 3.

TABLE 3

| Functional mode | BYP | CE | RST | ALT_EN | D_EN | FB_EN | Q_EN |
|---|---|---|---|---|---|---|---|
| Normal | 0 | 1 | 0 | 0 | 1 | 0 | 1 |
| Bypass | 1 | x | 0 | 0 | 1 | 1 | 0 |
| Disable clock | 0 | 0 | 0 | 0 | 0 | 1 | 1 |
| Reset flip-flop | 0 | 0 | 1 | 1 | 0 | 0 | 1 |
| Enable scan chain | 0 | 0 | 0 | 1 | 0 | 0 | 1 |

Numerous logic circuits may be used to perform the logic functions summarized above in Table 3 by those skilled in the art after reading this disclosure, and therefore specific implementations of such logic circuits are not provided herein for simplicity.

Figure 8:
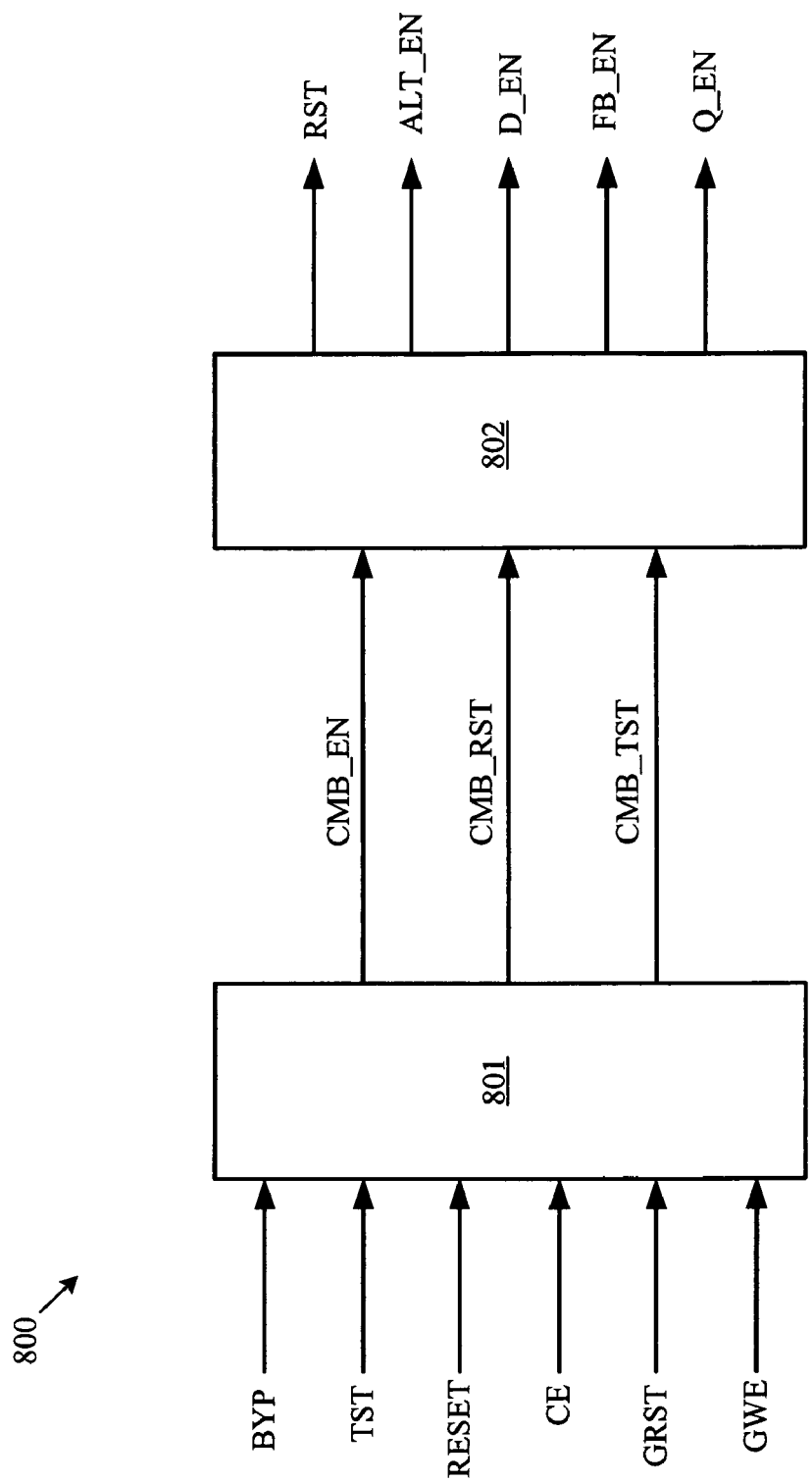
FIG. 8 is a block diagram of an exemplary control circuit for generating the control signals for the flip-flop circuit of FIG. 7.

For other embodiments, flip-flop circuit 700 may be implemented in systems that include a global write enable signal GWE, a local reset signal RESET, and a test signal TST, wherein assertion of GWE allows for global write operations, assertion of RESET allows for local reset operations, and assertion of TST allows for scan chain operations. For such embodiments, flip-flop circuit 700 may be coupled to a control circuit having inputs to receive BYP, TST, RESET, CE, GRST, and GWE, and having outputs to generate RST, ALT_EN, D_EN, FB_EN, and Q_EN, for example, as illustrated in FIG. 8. Control circuit 800 includes a first portion 801 and a second portion 802. First portion 801 includes inputs to receive BYP, TST, RESET, CE, GRST, and GWE, and includes outputs to generate a combined enable signal CMB_EN, a combined reset signal CMB_RST, and a combined test signal CMB_TST. Second portion 802 includes inputs to receive CMB_EN, CMB_RST, and CMB_TST, and includes outputs to generate RST, ALT_EN, D_EN, FB_EN, and Q_EN. For some embodiments, first portion 801 is configured to generate CMB_EN, CMB_RST, and CMB_TST in response to BYP, TST, RESET, CE, GRST, and GWE according to the logical expressions CMB_EN = (CE * GWE) + BYP; CMB_RST = RESET * GWE * BYP_bar; and CMB_TST = TST * BYP_bar, where "*" denotes the logical AND function and "+" denotes the logical OR function. Second portion 802 is configured to generate RST, ALT_EN, D_EN, FB_EN, and Q_EN in response to CMB_EN, CMB_RST, and CMB_TST according to the logical expressions RST = CMB_RST; ALT_EN = (CMB_TST * CMB_EN) + (CMB_RST * BYP_bar); D_EN = CMB_EN * CMB_TST_bar * CMB_RST_bar; FB_EN = (BYP + CMB_EN_bar) * CMB_RST_bar; and Q_EN = BYP_bar.

The logic functions performed by control circuit 800 for implementing various operations of flip-flop circuit 700 are summarized below in the truth table of Table 4, where "x" indicates a don't care logic state.

TABLE 4

| Operation | BYP | GRST | GWE | RESET | CE | TST |
|---|---|---|---|---|---|---|
| Bypass | 1 | x | x | x | x | x |
| Asynchronous reset | 0 | 1 | x | x | x | x |
| Disable global write | 0 | 0 | 0 | x | x | x |
| Synchronous reset | 0 | 0 | 1 | 1 | x | x |
| Disable clock | 0 | 0 | 1 | 0 | 0 | x |
| Test mode | 0 | 0 | 1 | 0 | 1 | 1 |
| Normal | 0 | 0 | 1 | 0 | 1 | 0 |

Note that for the exemplary operation of control circuit 800 as depicted in Table 4, the input control signals are prioritized according to the expression BYP>GRST>GWE>RESET>CE>TST. Thus, for example, because BYP has the highest priority, assertion of BYP causes flip-flop circuit 700 to operate in the bypass mode, irrespective of the other control signals.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A flip-flop circuit having an input to receive an input signal and having an output to provide an output signal, comprising:

a flip-flop having a data input, a clock input, and a data output;

a first pass gate having an input to receive the input signal, an output coupled to the data input of the flip-flop, and a control terminal to receive a first control signal;

a second pass gate having a first data terminal coupled to the data input of the flip-flop, a second data terminal coupled to the output of the flip-flop circuit, and a control terminal to receive a second control signal; and a third pass gate having an input coupled to the data output of the flip-flop, an output coupled to the output of the flip-flop circuit, and a control terminal to receive a third control signal, wherein the first, second, and third control signals are unique signals that are generated in response to a clock enable signal and a bypass signal.

2. The flip-flop circuit of claim 1, wherein the flip-flop circuit further includes a control circuit comprising:

a first OR gate having inputs to receive the clock enable signal and the bypass signal, and having an output to generate the first control signal;

a second OR gate having inputs to receive the bypass signal and a logical complement of the clock enable signal, and having an output to generate the second control signal; and an inverter having an input to receive the bypass signal and having an output to generate the third control signal.

3. The flip-flop circuit of claim 1, wherein the first control signal comprises the clock enable signal, the second control signal comprises a logical combination of the clock enable signal and the bypass signal, and the third control signal comprises a logical complement of the bypass signal.

4. The flip-flop circuit of claim 3, wherein the second pass gate is conductive if either the clock enable signal is de-asserted or the bypass signal is asserted.

5. The flip-flop circuit of claim 1, further comprising:

a pull-down transistor coupled between the data input of the flip-flop and ground potential and having a gate to receive a reset signal.

6. The flip-flop circuit of claim 5, wherein assertion of the reset signal forces the output of the flip-flop to a logic low state.

7. The flip-flop circuit of claim 1, further comprising:

a fourth pass gate having an input to receive a scan chain signal, a control terminal to receive a fourth control signal, and an output;

a fifth pass gate having an input coupled to the output of the fourth pass gate, a control terminal to receive a fifth control signal, and an output coupled to the data input of the flip-flop; and a pull-down transistor coupled between the input of the fifth pass gate and ground potential and having a gate responsive to the fourth control signal.

8. The flip-flop circuit of claim 7, wherein the fourth control signal comprises a reset signal.

9. The flip-flop circuit of claim 8, wherein the fifth control signal comprises a logical combination of the reset signal and a test signal.

10. The flip-flop circuit of claim 1, wherein the second pass gate is configured to selectively route either the output signal to the data input of the flip-flop or the input signal to the output of the flip-flop circuit.

* * * * *